(12) United States Patent
Takeda et al.

(10) Patent No.: US 10,796,934 B2
(45) Date of Patent: Oct. 6, 2020

(54) SUBSTRATE PROCESSING APPARATUS, METHOD OF MANUFACTURING SEMICONDUCTOR DEVICE AND ELECTRODE FIXING PART

(71) Applicant: Kokusai Electric Corporation, Tokyo (JP)

(72) Inventors: Tsuyoshi Takeda, Toyama (JP); Tatsuya Nishino, Toyama (JP); Takashi Yahata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/294,495

(22) Filed: Mar. 6, 2019

(65) Prior Publication Data

US 2019/0206705 A1 Jul. 4, 2019

Related U.S. Application Data

(63) Continuation of application No. PCT/JP2016/077857, filed on Sep. 21, 2016.

(51) Int. Cl.
*H01L 21/00* (2006.01)
*H01L 21/67* (2006.01)
(Continued)

(52) U.S. Cl.
CPC .. *H01L 21/67098* (2013.01); *H01J 37/32449* (2013.01); *H01J 37/32532* (2013.01);
(Continued)

(58) Field of Classification Search
CPC ......... H01L 21/67098; H01L 21/67109; H01L 21/31; H01L 21/67017; H01L 21/67739; H01L 21/02274; H01L 21/0228; H01L 21/02219; H01L 21/02164; H01J 37/32532; H01J 37/32449; C23C 16/45523; C23C 16/401; C23C 16/46; C23C 16/52; C23C 16/507; C23C 16/4584
(Continued)

(56) References Cited

U.S. PATENT DOCUMENTS 8,297,224 B2 * 10/2012 Ishimaru ............... C23C 16/345
118/723 R
8,394,200 B2 * 3/2013 Matsuura ............. C23C 16/452
118/715

(Continued)

FOREIGN PATENT DOCUMENTS

JP 2007-324477 A 12/2007

*Primary Examiner* — Vu A Vu
(74) *Attorney, Agent, or Firm* — Edell, Shapiro & Finnan, LLC

(57) ABSTRACT

According to one aspect of the technique described herein, there is provided a technique including: a reaction tube defining a processing chamber wherein a substrate is processed; an electrode provided at an outer circumferential surface of the reaction tube and configured to generate plasma in the process chamber; an electrode fixing part configured to fix the electrode thereto; a heater provided at an outer circumferential surface of the electrode fixing part and configured to heat an inside of the reaction tube; and a spacer configured to provide a predetermined gap between the electrode and a surface of the electrode fixing part.

16 Claims, 9 Drawing Sheets

(51) Int. Cl.
  *H01J 37/32* (2006.01)
  *H01L 21/677* (2006.01)
  *H01L 21/31* (2006.01)

(52) U.S. Cl.
  CPC ........ *H01L 21/31* (2013.01); *H01L 21/67017* (2013.01); *H01L 21/67109* (2013.01); *H01L 21/67739* (2013.01)

(58) Field of Classification Search
  USPC .......................................................... 439/795
  See application file for complete search history.

(56) References Cited

U.S. PATENT DOCUMENTS

| | | | | |
|---|---|---|---|---|
| 8,736,049 | B1* | 5/2014 | Cheng | H01L 23/467 257/712 |
| 9,039,912 | B2* | 5/2015 | Toyoda | C23C 16/452 216/71 |
| 2006/0260544 | A1* | 11/2006 | Toyoda | C23C 16/50 118/715 |
| 2014/0174359 | A1* | 6/2014 | Tabata | C23C 16/503 118/723 ER |

\* cited by examiner

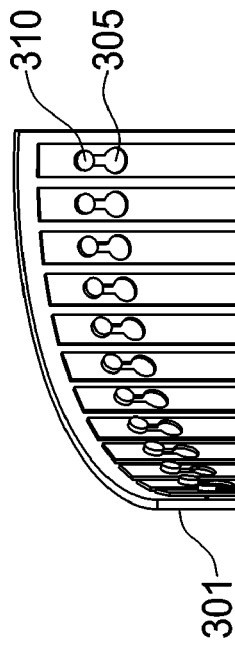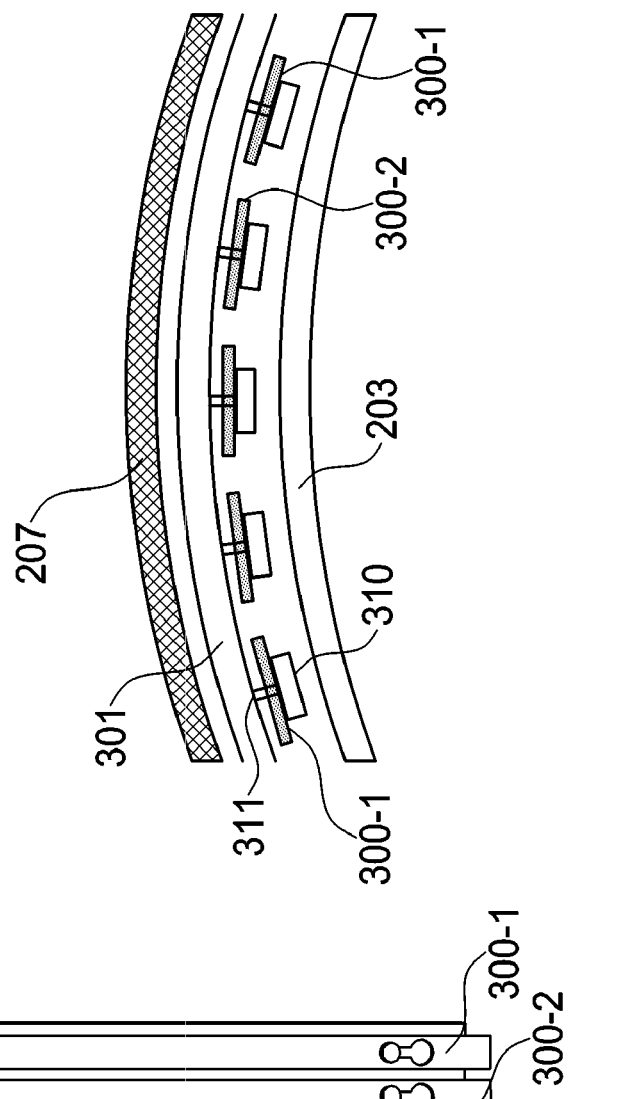
FIG. 3A
FIG. 3B

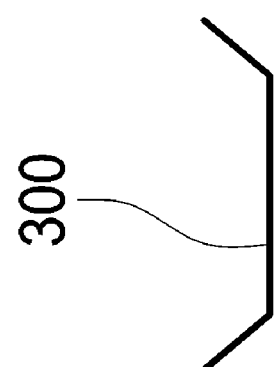
FIG. 5A
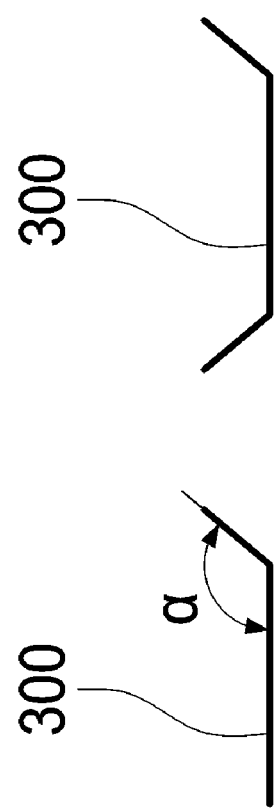
FIG. 5B
FIG. 5C
FIG. 5D
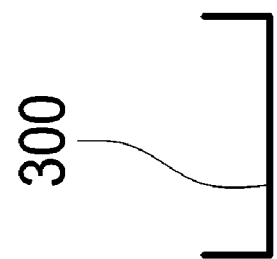
FIG. 5E
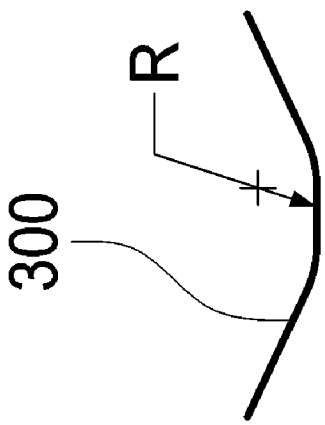
FIG. 5F
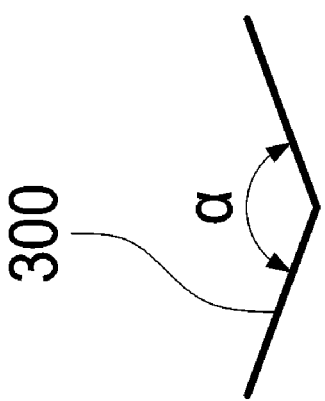
FIG. 5G

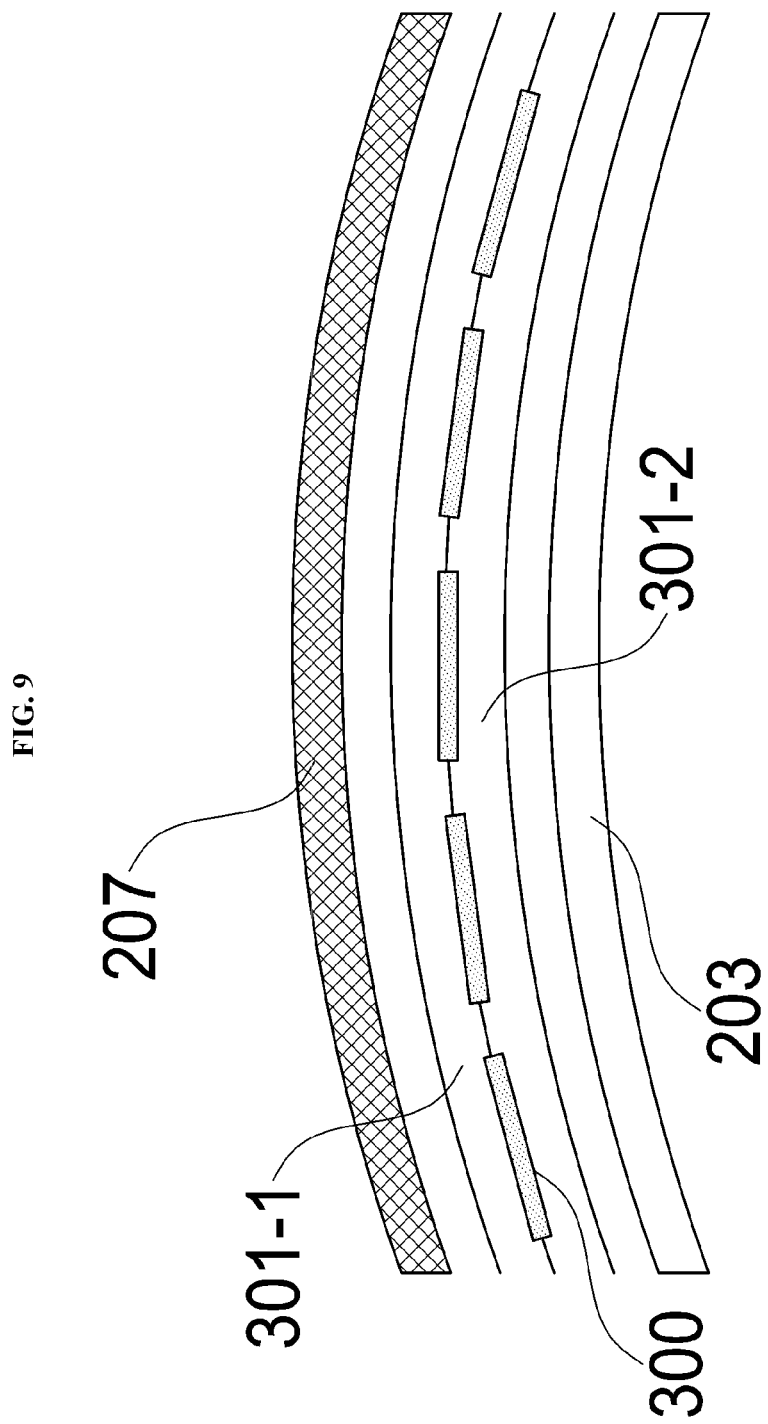

SUBSTRATE PROCESSING APPARATUS, METHOD OF MANUFACTURING SEMICONDUCTOR DEVICE AND ELECTRODE FIXING PART

CROSS REFERENCE TO RELATED APPLICATIONS

This application is a continuation of International Application No. PCT/JP 2016/077857, filed on Sep. 21, 2016, the entire contents of which are hereby incorporated by reference.

TECHNICAL FIELD

The present disclosure relates to a substrate processing apparatus, a method of manufacturing a semiconductor device and an electrode fixing part.

BACKGROUND

As one of manufacturing processes of a semiconductor device, a substrate processing for forming various films such as an insulating film, a semiconductor film and a conductor film on a substrate accommodated in a process chamber of a substrate processing apparatus or removing the various films formed on the substrate may be performed. The various films may be formed by loading the substrate into the process chamber and supplying a source gas and a reactive gas into the process chamber according to the substrate processing.

For manufacturing a mass production device in which a fine pattern is formed thereon, it is required to lower a temperature of the substrate processing in order to suppress the diffusion of impurities and to use a material having a low heat resistance such as an organic material.

In order to address the problem described above, the substrate processing may be performed by using plasma. However, when a plasma electrode is deformed by the secular change or the heat radiated from a heating apparatus, variations may occur in the amount or distribution of active species such as ions and radicals generated by the plasma. Therefore, it may be difficult to process the films uniformly according to the substrate processing.

SUMMARY

Described herein is a technique capable of performing a substrate processing uniformly.

According to one aspect of the technique described herein, there is provided a technique including: a reaction tube defining a processing chamber wherein a substrate is processed; an electrode provided at an outer circumferential surface of the reaction tube and configured to generate plasma in the process chamber; an electrode fixing part configured to fix the electrode thereto; a heater provided at an outer circumferential surface of the electrode fixing part and configured to heat an inside of the reaction tube; and a spacer providing a predetermined distance between the electrode and a surface of the electrode fixing part.

BRIEF DESCRIPTION OF THE DRAWINGS

FIG. 3A schematically illustrates a quartz cover with an electrode fixed thereto according to the embodiment, and FIG. 3B schematically illustrates a state in which a heater, the quartz cover, the electrode, a protrusion 310 for fixing the electrode and a reaction tube are assembled according to the embodiment.

FIGS. 5A through 5G schematically illustrate horizontal cross-sections of examples of the electrode according to the embodiment. FIG. 5A schematically illustrates an example of the electrode with one end portion thereof bent at a substantially right angle, FIG. 5B schematically illustrates an example of the electrode with both end portions thereof bent at a substantially right angle, FIG. 5C schematically illustrates an example of the electrode with one end portion thereof bent at an obtuse angle, FIG. 5D schematically illustrates an example of the electrode with both end portions thereof bent at an obtuse angle, FIG. 5E schematically illustrates an example of the electrode having a V-shape, FIG. 5F schematically illustrates an example of the electrode with a central portion thereof bent with a predetermined curvature radius R and FIG. 5G schematically illustrates an example of the electrode having an arc shape.

FIG. 6A is a side view of the spacer according to the embodiment and FIG. 6B is a front view of the spacer according to the embodiment.

FIG. 9 schematically illustrates a first modified example of the embodiment.

DETAILED DESCRIPTION

Embodiment

Hereinafter, an embodiment according to the technique will be described with reference to FIGS. 1 through 5G.

(1) CONFIGURATION OF SUBSTRATE PROCESSING APPARATUS

Figure 1:
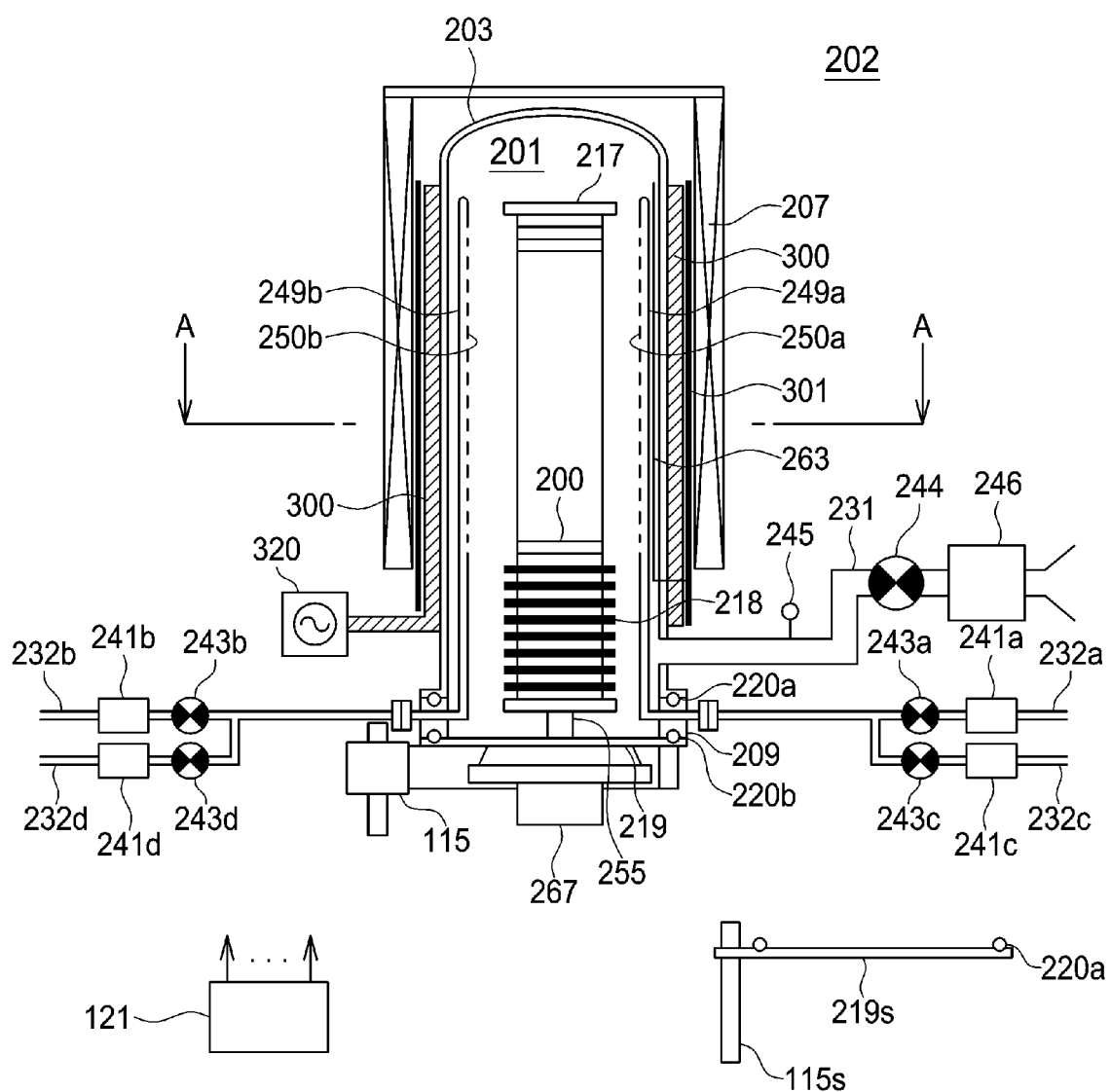
FIG. 1 schematically illustrates a vertical cross-section of a vertical type processing furnace of a substrate processing apparatus preferably used in an embodiment described herein.

Hereinafter, a substrate processing apparatus preferably used in the embodiment will be described.
Heating Apparatus
As shown in FIG. 1, a processing furnace 202 of the substrate processing apparatus (hereinafter, also referred to as a "vertical type substrate processing apparatus") includes a heater 207 serving as a heating apparatus (heating mechanism). The heater 207 is cylindrical, and vertically installed while being supported by a heater base (not shown) serving as a support plate. In addition, the heater 207 also functions as an activation mechanism (excitation mechanism) for activating (exciting) gases by heat.

A quartz cover 301 serving as an electrode fixing part described later is provided on an inner side of the heater 207, and an electrode 300 (also referred to as a "plasma electrode") of a plasma generator described later is provided on an inner side of the quartz cover 301. A reaction tube 203 is provided on an inner side of the electrode 300 so as to be concentric with the heater 207. The reaction tube 203 is made of a heat resistant material such as quartz ($SiO_2$) and silicon carbide (SiC), and cylindrical with a closed upper end and an open lower end. A manifold 209 is provided under the reaction tube 203 so as to be concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 16. An O-ring 220a serving as a sealing part is provided between the manifold 209 and the reaction tube 203. As the manifold 209 is supported by the heater base, the reaction tube 203 is installed to be perpendicular to the heater 207. A process vessel (reaction vessel) is constituted mainly by the reaction tube 203 and the manifold 209. A process chamber 201 is provided in a hollow cylindrical portion of the process vessel. The process chamber 201 is defined by the reaction tube 203. The process chamber 201 is configured to accommodate vertically arranged wafers 200 serving as substrates in a horizontal orientation in a multistage manner. However, the process vessel is not limited to the above-described configuration. For example, in the present specification, only the reaction tube 203 may be referred to as the "process vessel".

Gas Supply System

Nozzles 249a and 249b are provided in the process chamber 201 through a sidewall of the manifold 209. Gas supply pipes 232a and 232b are connected to the nozzles 249a and 249b, respectively. As described above, the two nozzles 249a and 249b and the two gas supply pipes 232a and 232b are provided in the process vessel. Various gases may be supplied into the process chamber 201 via the two nozzles 249a and 249b and the two gas supply pipes 232a and 232b. In addition, when only the reaction tube 203 is referred to as the "process vessel", the nozzles 249a and 249b may be provided in the process chamber 201 through a sidewall of the reaction tube 203.

Mass flow controllers (MFCs) 241a and 241b serving as flow rate controllers (flow rate control mechanisms) and valves 243a and 243b serving as opening/closing valves are sequentially installed at the gas supply pipes 232a and 232b, respectively, from the upstream side to the downstream side of the gas supply pipes 232a and 232b. Gas supply pipes 232c and 232d configured to supply an inert gas are connected to the gas supply pipes 232a and 232b at the downstream sides of the valves 243a and 243b, respectively. MFCs 241c and 241d and valves 243c and 243d are sequentially installed at the gas supply pipes 232c and 232d, respectively, from the upstream side to the downstream side of the gas supply pipes 232c and 232d.

The nozzles 249a and 249b are provided in an annular space between an inner wall of the reaction tube 203 and the wafers 200 accommodated in the process chamber 201, and extend from a lower portion of the inner wall of the reaction tube 203 to an upper portion of the inner wall of the reaction tube 203 along a stacking direction of the wafers 200, respectively. That is, the nozzles 249a and 249b are provided perpendicularly to edges (peripheral portions) of the wafers 200 accommodated in the process chamber 201, respectively. In other words, the nozzles 249a and 249b are provided perpendicularly to surfaces (flat surfaces) of the wafers 200, respectively. A plurality of gas supply holes 250a and a plurality of gas supply holes 250b configured to supply the gases are provided at side surfaces of the nozzles 249a and 249b, respectively. The plurality of gas supply holes 250a and the plurality of gas supply holes 250b are open toward the center of the reaction tube 203, and configured to supply the gases toward the wafers 200, respectively. The plurality of gas supply holes 250a and the plurality of gas supply holes 250b are provided from the lower portion of the reaction tube 203 to the upper portion thereof, respectively.

According to the present embodiment, the gases are supplied through the nozzles 249a and 249b provided in the vertical annular space (that is, cylindrical space) defined by an inner surface of the sidewall (that is, the inner wall) of the reaction tube 230 and the edges (peripheral portions) of the wafers 200 arranged in the reaction tube 203. The gases are injected into the reaction tube 203 toward the wafers 200 through the plurality of gas supply holes 250a and the plurality of gas supply holes 250b of the nozzles 249a and 249b, respectively. The gases injected into the reaction tube 203 mainly flow parallel to the surfaces of the wafers 200, that is, in a horizontal direction, to uniformly supply the gases to each of the wafers 200 and to form a film with uniform thickness on the wafers 200. After passing the surfaces of the wafers 200, the gases flow toward an exhaust port, that is, toward an exhaust pipe 231 described later. However, the flow direction of the gases may vary depending on the location of the exhaust port, and is not limited to the vertical direction.

A source gas containing a predetermined element is supplied into the process chamber 201 through the gas supply pipe 232a provided with the MFC 241a and the valve 243a and the nozzle 249a. For example, a silane source gas containing silicon (Si) as the predetermined element may be used as the source gas.

The silane source gas may refer to a silane source in gaseous state under normal temperature and normal pressure or a gas obtained by vaporizing a silane source in liquid state under normal temperature and normal pressure. In the present specification, the term "source" may indicate only "source in liquid state", only "source in gaseous state" and both of "source in liquid state" and "source in gaseous state".

For example, a source gas containing silicon and an amino group (amine group) (that is, an aminosilane source gas) may be used as the silane source gas. The aminosilane source refers to a silane source containing an amino group. That is, the aminosilane source is a silane source containing an alkyl group such as a methyl group, an ethyl group and a butyl group. The aminosilane source may also refer to a source containing at least silicon, nitrogen (N) and carbon (C). That is, the aminosilane source in the present specification may also indicate an organic-based source or an organic aminosilane source.

For example, bis(tertiarybutylamino)silane gas ($SiH_2[NH(C_4H_9)]_2$, abbreviated as BTBAS) gas may be used as the aminosilane source gas. The BTBAS gas is a source gas containing one silicon atom in a molecule, including Si—N bond and N—C bond, and free of S—C bond. The BTBAS gas serves as a silicon source.

When a liquid source in a liquid state under normal temperature and normal pressure such as the BTBAS is used as the source gas, the liquid source is vaporized by a vaporization system (not shown) such as a vaporizer or a bubbler, and then is supplied as the source gas such as the BTBAS gas.

A reactant (hereinafter, also referred to as a "reactive gas") having a different chemical structure from the source gas is supplied into the process chamber 201 through the gas supply pipe 232b provided with the MFC 241b and the valve 243b and the nozzle 249b. For example, an oxygen (O)-containing gas may be used as the reactant.

The oxygen-containing gas serves as an oxidizing agent (oxidation gas), that is, an oxygen source. For example, a gas such as oxygen ($O_2$) gas and water vapor ($H_2O$ gas) may be used as the oxygen-containing gas. When the oxygen gas is used as the oxygen-containing gas (oxidizing agent), for example, the oxygen gas may be plasma-excited by using a plasma source described later, and the plasma-excited oxygen gas (hereinafter, also referred to as "$O_2$* gas") may be supplied into the process chamber 201 as the reactant (reactive gas).

An inert gas such as nitrogen gas ($N_2$ gas) is supplied into the process chamber 201 through the gas supply pipe 232c and 232d provided with the MFCs 241c and 241d and the valves 243c and 243d, respectively, and the nozzles 249a and 249b.

A source gas supply system serving as a first gas supply system is constituted mainly by the gas supply pipe 232a, the MFC 241a and the valve 243a. A reactant gas supply system (hereinafter, also referred to as a "reactive gas supply system") serving as a second gas supply system is constituted mainly by the gas supply pipe 232b, the MFC 241b and the valve 243b. An inert gas supply system is constituted mainly by the gas supply pipes 232c and 232d, the MFCs 241c and 241d and the valves 243c and 243d. The source gas supply system, the reactant supply system and the inert gas supply system may be collectively referred to as a gas supply system (gas supply mechanism) for simplicity.

Substrate Retainer

As shown in FIG. 1, a boat 217 serving as a substrate retainer aligns the wafers 200, for example, from 25 to 200 wafers in the vertical direction and supports the wafers 200, while the wafers 200 are horizontally oriented with their centers aligned with each other. That is, the boat 217 supports (accommodates) the wafers 200 with predetermined intervals therebetween. The boat 217 is made of a heat resistant material such as quartz and SiC. Insulating plates 218 are provided in multiple stages under the boat 217. The insulating plates 218 are made of a heat-resistant material such as quartz and SiC so as to suppress the heat transfer from the heater 207 to the seal cap 219. However, the present embodiment is not limited thereto. For example, instead of providing the insulating plates 218 under the boat 217, a heat insulating cylinder (not shown) serving as a cylindrical part may be provided under the boat 217. For example, the heat insulating cylinder is made of a heat resistant material such as quartz and SiC.

Plasma Generator

Hereinafter, a plasma generator (also referred to as a "plasma generating mechanism") will be described with reference to FIGS. 1 through 3B.

Figure 2:
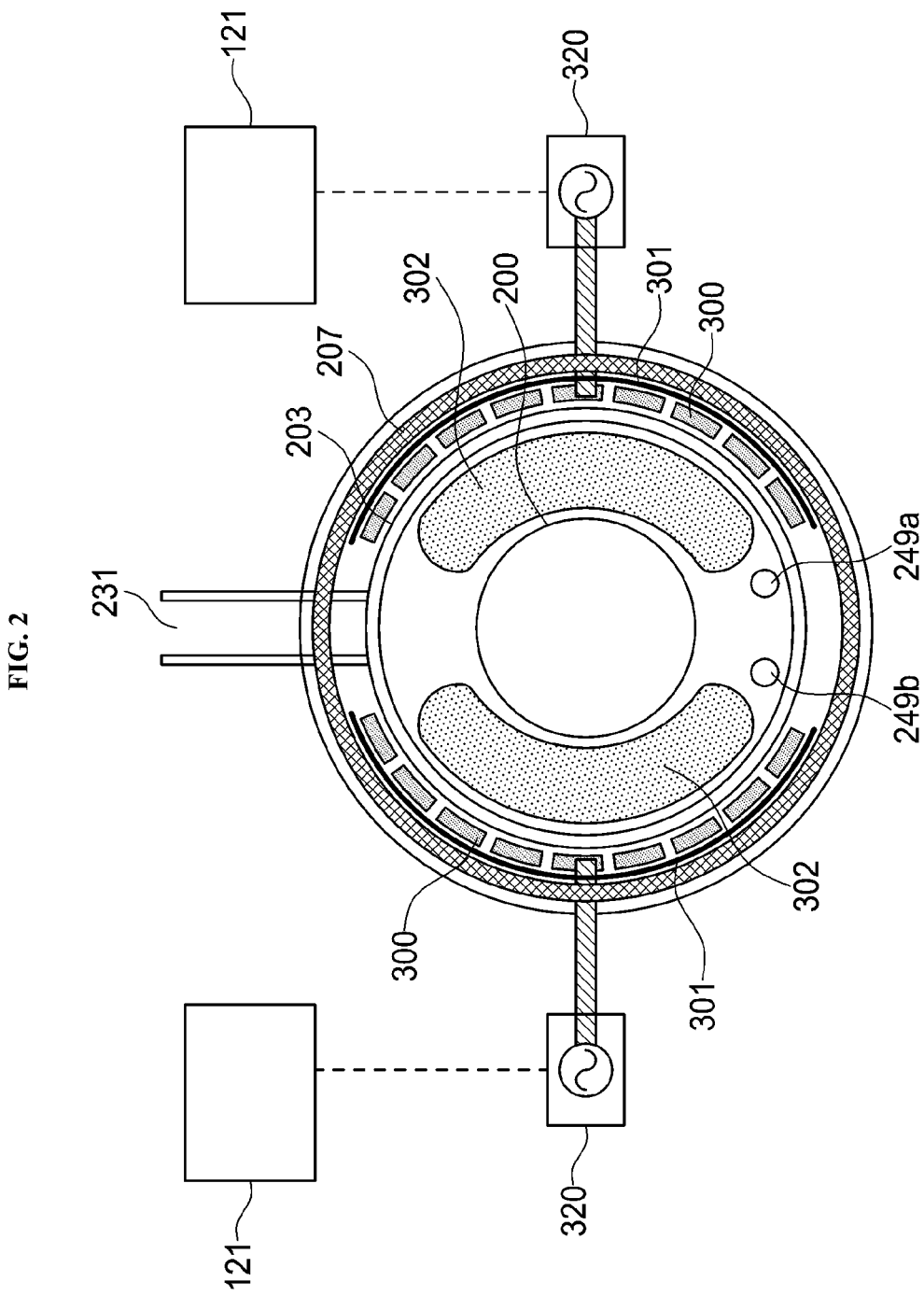
FIG. 2 schematically illustrates a cross-section taken along the line A-A of the vertical type processing furnace of the substrate processing apparatus shown in FIG. 1.

As shown in FIG. 2, the plasma is generated using capacitively coupled plasma (hereinafter, abbreviated as "CCP") in the reaction tube 203, which is a vacuum partition wall made of a material such as quartz, when the reactive gas is supplied.

As shown in FIGS. 2 and 3A, the electrode 300 is formed of a thin plate having a rectangular shape elongated along the stacking direction of the wafers 200 (arrangement direction of the wafers 200). The electrode 300 includes first electrodes (each of which will also be referred to as a "hot electrode") 300-1 connected to a high frequency power supply 320 via a matching mechanism (not shown) and second electrodes (each of which will also be referred to as a "ground electrode") 300-2 connected to a ground serving as a reference potential (that is, the second electrode 300-2 is grounded). The first electrodes 300-1 and the second electrodes 300-2 are alternately arranged. In the present embodiment, the first electrodes 300-1 and the second electrodes 300-2 may be collectively referred to as the electrode 300 unless they need to be distinguished from each other. The electrode 300 is provided between the reaction tube 203 and the heater 207 along an outer wall of the reaction tube 203. The electrode 300 is arc-shaped. For example, the electrode 300 is fixed on a surface of an inner wall of a quartz cover 301 described later. For example, the quartz cover 301 is arc-shaped. A central angle of the arc-shaped quartz cover 301 may range, for example, from 30° to 240°. A plasma active species 302 is generated in the reaction tube 203 by supplying the high frequency power (for example, high frequency power with a frequency of 13.56 MHz) from the high frequency power supply 320 to the electrode 300 via the matching mechanism (not shown). The generated plasma active species 302 is supplied onto the surfaces of the wafers 200 from the peripheries of the wafers 200 to process the wafers 200 by the plasma. The plasma generator (plasma generating mechanism) is constituted mainly by the electrode 300 and the high frequency power supply 320. The plasma generator may further include the matching mechanism (not shown) and the electrode fixing part such as the quartz cover 301.

The electrode 300 may be made of a metal such as aluminum, copper and stainless steel. However, when the electrode 300 is made of an oxidation resistant material such as nickel, it is possible to process the wafers 200 while suppressing the deterioration of the electric conductivity of the surface of the electrode 300. By suppressing the deterioration of the electric conductivity of the surface of the electrode 300, it is also possible to suppress the deterioration of the plasma generation efficiency.

Figure 4A:
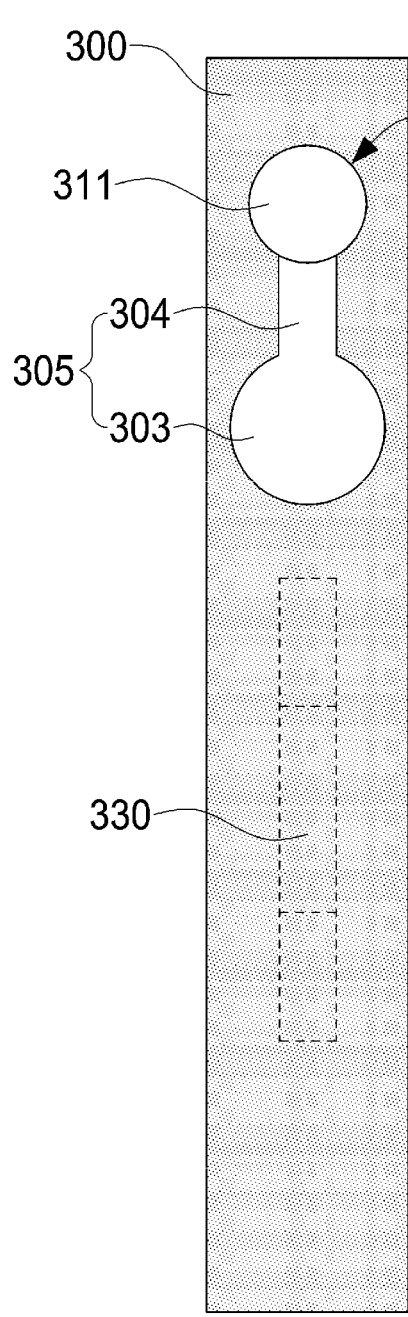
FIG. 4A is a partial enlarged front view of the electrode according to the embodiment.
Figure 4B:
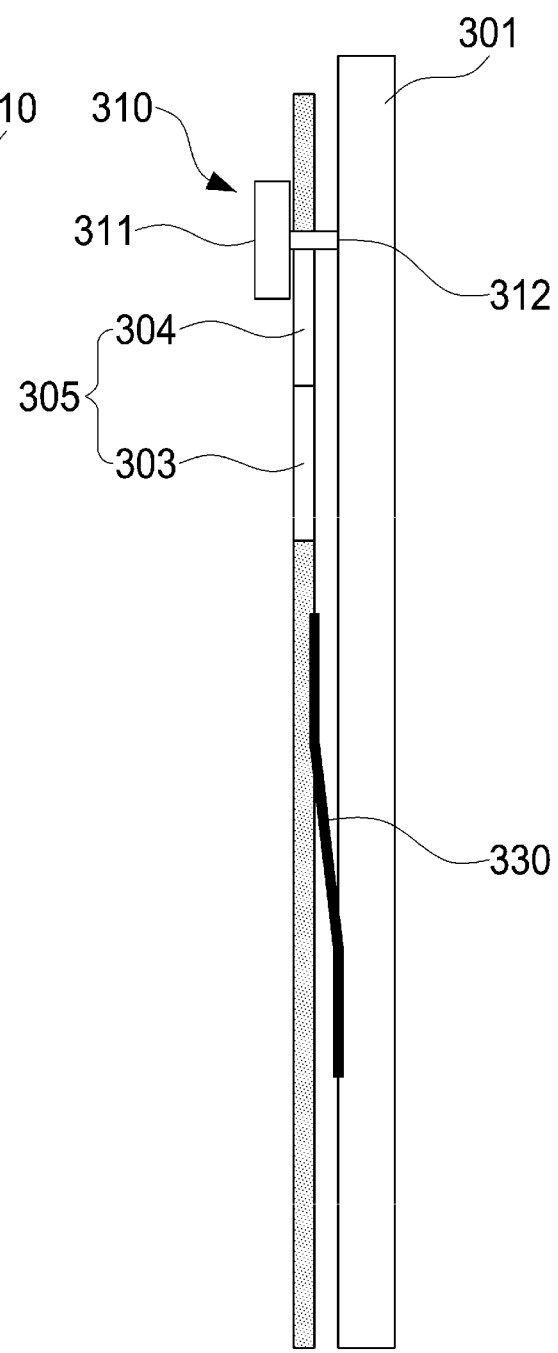
FIG. 4B is a partial enlarged side view for explaining a state in which the electrode is fixed to the quartz cover according to the embodiment.

As shown in FIG. 4A, the electrode 300 is provided with a cutout portion 305. The cutout portion 305 is constituted by a circular cutout portion 303 through which a protrusion head portion 311 described later passes and a slit portion 304 along which a protrusion shaft portion 312 is slidable.

The electrode 300 needs to be formed to have sufficient strength. In addition, the electrode 300 needs to be formed so as not to significantly reduce the efficiency of heating the wafers 200 by the heat source (heater 207). For example, it is preferable to set the thickness of an electrode plate of the electrode 300 within a range from 0.1 mm to 1 mm, and the width of the electrode plate within a range from 5 mm to 30 mm. In addition, the electrode 300 includes a bent structure serving as a deformation suppressing structure for suppressing the deformation due to being heated by the heater 207. Examples of the bent structure are shown in FIGS. 5A through 5G. Because the electrode 300 is disposed between the quartz reaction tube 203 and the heater 207, as shown in FIGS. 5A through 5G, it is preferable to set a bending width h of a side portion of the electrode 300 within a range of 1 mm to 5 mm because of the restriction of the space. When the bending width is less than 1 mm, it is difficult to obtain the effect of suppressing the deformation. When the bending width is greater than 5 mm, it is necessary to increase the space for the electrode 300, thus increasing the size of the whole structure.

As shown in FIGS. 5A and 5B, for example, as the deformation suppressing structure of the electrode 300, it is possible to obtain the effect of suppressing the deformation with a simple structure by configuring the bending angle α of the deformation suppressing structure to be an acute angle or a right angle. When the bending angle α is an acute angle or a right angle, it is preferable to set the bending angle α within a range from 10° to 90°. In addition, a coating film may be formed on the surface of the electrode 300 by thermal oxidation, and particles may be generated by the coating film being peeled off due to the thermal stress generated in the electrode 300 when the electrode 300 is heated during the substrate processing. Therefore, by setting the bending angle α to be an obtuse angle as shown in FIGS. 5C through 5G, the thermal stress may become less concentrated on the bent portion of the bent structure, and the generation of the particles can be reduced. In addition, as shown in FIGS. 5F and 5G, it is possible to further increase the effect of alleviating the concentration of the thermal stress and to further reduce the generation of the particles by forming the bent portion into an arc shape. As shown in FIGS. 5C through 5E, it is preferable to set the bending angle α to be a right angle or obtuse angle, for example, within a range from 90° to 175°. In addition, as shown in FIGS. 5F and 5G, it is preferable to set the radius of curvature R of the central portion of the electrode 300 within a range from 1 mm to 60 mm. As shown in FIGS. 5B and 5D, by providing two bent portions, it is possible to provide a structure highly resistant against the torsional deformation caused by the stress applied in the twisting direction of the electrode plate. Therefore, it is possible to use the electrode 300 in a high temperature range where the twisting stress is easily generated.

In the present embodiment, the plasma in CCP mode is generated in the vertical type substrate processing apparatus by setting a temperature of the reaction tube 203 to 500° C., a pressure of the reaction tube 203 to 100 Pa and a frequency of the high frequency power supply 320 to 13.56 MHz. The electrode 300 having a length of 1 m, a width of 15 mm and a thickness of 1 mm is used to generate the plasma in CCP mode. A plurality of electrodes 300 having alternating polarities with an electrode pitch (distance between centers of the electrodes) of 25 mm are provided alternately on the outer wall of the reaction tube 203. The plasma in CCP mode is generated in the vertical type substrate processing apparatus using the above-described configurations.

In the present embodiment, it is preferable that a pressure in the processing furnace 202 during the substrate processing is controlled to a predetermined pressure. For example, the pressure in the processing furnace 202 may range from 10 Pa to 300 Pa. When the pressure in the processing furnace 202 is lower than 10 Pa, the mean free path of gas molecules may be longer than the Debye length of plasma, and the direct collision between the plasma and the wall of the processing furnace 202 wall may become conspicuous. Therefore, it is difficult to suppress the generation of the particles. In addition, when the pressure in the processing furnace 202 is higher than 300 Pa, the generation efficiency of the plasma may be saturated. Therefore, even if the reactive gas is supplied, the amount of the generated plasma may not be changed, so that the reactive gas may be wasted. In addition, the mean free path of the gas molecules may be shortened, so that the transport efficiency of the plasma active species to the wafers 200 may deteriorate.

Electrode Fixing Part

Hereinafter, the quartz cover 301 serving as the electrode fixing part for fixing the electrode 300 will be described with reference to FIGS. 3A, 3B, 4A and 4B. As shown in FIGS. 3A through 4B, by hooking the cutout portions 305 of the plurality of electrodes 300 to a plurality of protrusions 310 provided on a surface of an inner wall of the curved quartz cover 301 and adjusting the positions of the cutout portions 305, the plurality of electrodes 300 are fixed to the quartz cover 301. In addition, the plural electrodes 300 formed as a united part (hook-type electrode part) integrated with the quartz cover 301 may be provided on the outer circumferential surface of the reaction tube 203. The quartz cover 301 and the plurality of electrodes 300 are made of a material such as quartz and a nickel alloy, respectively.

For example, it is preferable to set the thickness of the quartz cover 301 within a range from 1 mm to 5 mm so that the quartz cover 301 has sufficient strength and the quartz cover 301 does not significantly lower the efficiency of heating the wafers 200 by the heater 207. When the thickness of the quartz cover 301 is less than 1 mm, it is difficult to obtain a desired strength or resistance against the weight of the quartz cover 301, temperature change and the like. When the thickness of the quartz cover 301 is greater than 5 mm, it is difficult to properly perform the heat treatment (substrate processing) on the wafers 200 because the thermal energy radiated from the heater 207 is absorbed by the quartz cover 301.

The quartz cover 301 includes the plurality of protrusions 310 provided on the surface of the inner wall of the curved quartz cover 301 facing the reaction tube 203. The plurality of protrusions 310 serve as rivet-shaped fixing portions for fixing the plurality of electrodes 300 to the quartz cover 301. Each of the plurality of protrusions 310 includes the protrusion head portion 311 and the protrusion shaft portion 312. A diameter of the protrusion head portion 311 is less than the diameter of the circular cutout portion 303 of the cutout portion 305 of the electrode 300, and the diameter of the protrusion shaft portion 312 is less than the width of the slit portion 304. The cutout portion 305 of the electrode 300 may have a shape similar to a keyhole. The slit portion 304 is configured to guide the protrusion shaft portion 312 when the protrusion shaft portion 312 slides in the slit portion 304. The protrusion head portion 311 has a structure that is not released from the slit portion 304. That is, the electrode fixing part includes a fixing portion. The fixing portion is constituted by the protrusion shaft portion 312 serving as a columnar portion with which the electrode 300 is engaged and the protrusion head portion 311 serving as a front end for suppressing the electrode 300 from being released from the fixing portion. Examples of the cutout portion 303 and the protrusion head portion 311 are shown in FIGS. 3A through 4B. However, the shape of the cutout portion 305 and the protrusion head portion 311 according to the present embodiment is not limited thereto.

Figure 6A:
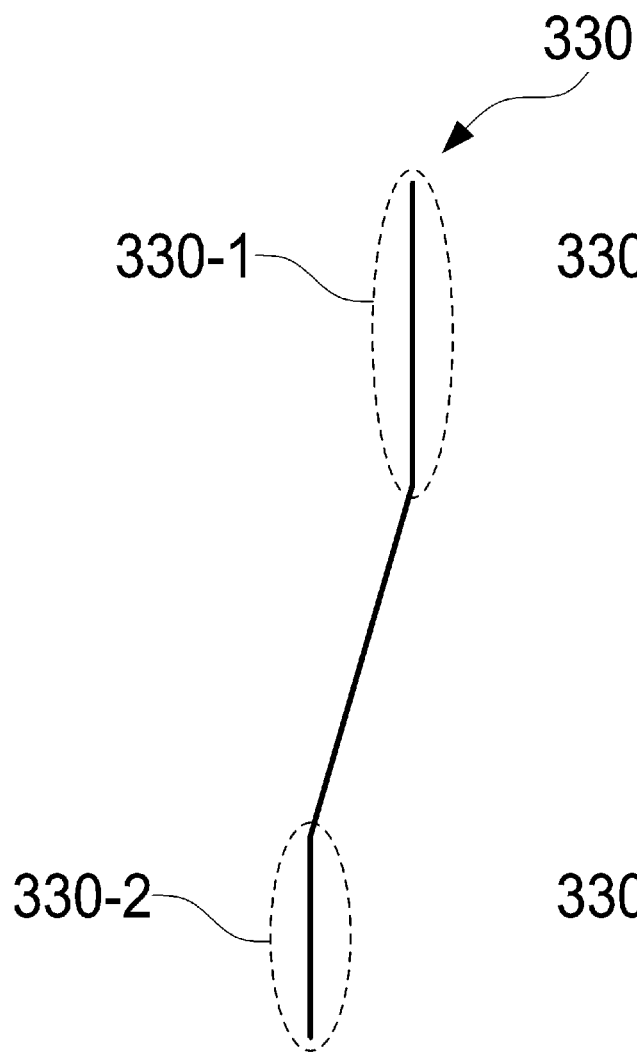
FIGS. 6A and 6B schematically illustrate a spacer according to the embodiment.
Figure 6B:
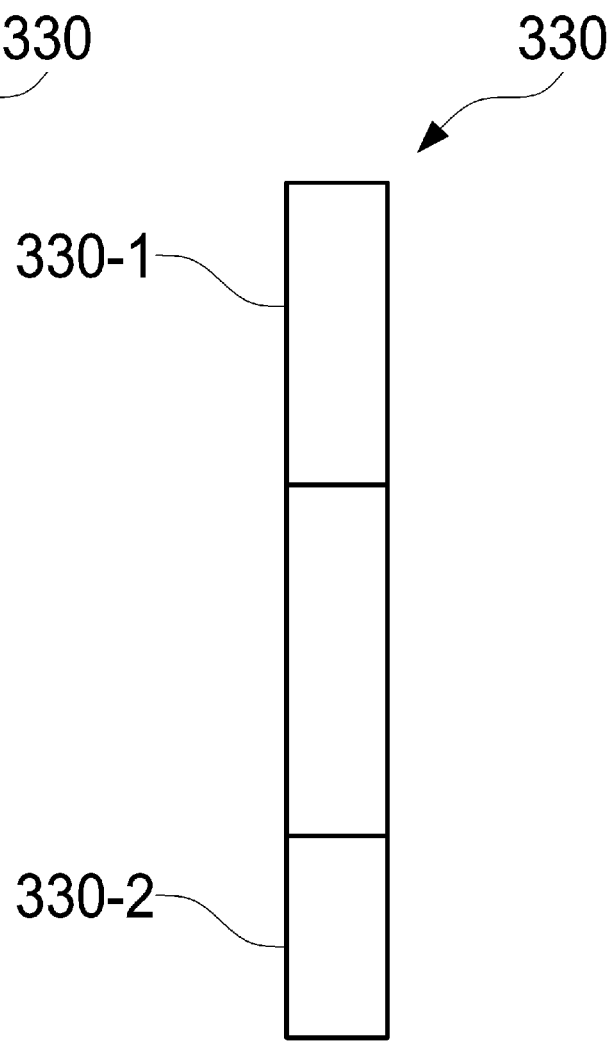

In order to keep the gap between the quartz cover 301 and the electrode 300 to be constant, an elastic body such as a spacer and a spring may be provided between the quartz cover 301. The elastic body may be integrated with the quartz cover 301 or the electrode 300. According to the present embodiment, as shown in FIGS. 6A and 6B, the spacer 330 has a structure integrated with the electrode 300. As shown in FIGS. 6A and 6B, two spacers 330 are provided on an upper portion and a lower portion of the electrode 300. However, the spacer 330 may also be further provided on a central portion of the electrode 300.

In order to obtain a high substrate processing capability at a temperature of 500° C. or less, the quartz cover 301 may be configured to be an arc shape having a central angle within a range from 30° to 240°. In addition, in order to avoid the generation of the particles, it is desirable to prevent the quartz cover 301 from contacting the components such as the exhaust pipe 231 serving as an exhaust port and the nozzles 249a and 249b. That is, the quartz cover 301 (that is, the electrode fixing part) is provided on the outer circumferential surface of the reaction tube 203 except where the components such as the nozzles 249a and 249b (which are part of the gas supply system provided in the reaction tube 203) and the exhaust pipe 231 (which is a part of a gas exhaust mechanism) are located. When the central angle of the quartz cover 301 is less than 30°, the number of the electrodes 300 that can be accommodated on the inner side of the quartz cover 301 may decrease. Thus, the amount of the plasma generated in the reaction tube 203 may decrease. Therefore, the substrate processing in the process chamber 201 is also affected. When the central angle of the quartz cover 301 is greater than 240°, the area covered by the quartz cover 301 on the side surface of the reaction tube 203 becomes too large, and the thermal energy from the heater 207 is blocked by the quartz cover 301. Therefore, it becomes more difficult for the thermal energy from the heater 207 to reach the wafers 200. Thus, the substrate processing in the process chamber 201 is affected. According to the present embodiment, a couple of quartz covers 301 with a central angle of 110° are arranged symmetrically. The electrode fixing part is constituted mainly by the quartz cover 301 for fixing the electrode 300. The electrode fixing part may further include the electrode 300 and the spacer 330 which will be described later in detail. When the electrode fixing part includes the electrode 300, the electrode fixing part may further include the plasma generator described above.

Spacer

Hereinafter, the spacer 330 for providing a gap between the electrode 300 and the surface of the quartz cover 301 will be described with reference to FIGS. 6A and 6B. The spacer 330 may be a part of the electrode fixing part. For example, the spacer 330 is formed of an elastic body having a leaf spring shape, and is fixed to one of the electrode 300 and the quartz cover 301. For example, the spacer 330 is made of a metal material such as SUS or a heat resistant material having elasticity. The spacer 330 is constituted by an electrode contacting portion 330-1 and a quartz cover contacting portion 330-2. The electrode contact portion 330-1 is in contact with the electrode 300 and the quartz cover contact portion 330-2 is in contact with the quartz cover 301. The spacer 330 is configured to press the electrode 300 toward the protrusion head portion 311. Although the spacer 330 is described as a leaf spring shape in the present embodiment, the spacer 330 is not limited thereto. For example, the spacer 330 having other shape may be used according to the present embodiment as long as the spacer 330 can maintain a constant distance from the electrode. For example, the spacer 330 may be formed in a cylindrical shape with a heat resistant part such as alumina and ceramic, and may be configured such that the protrusion shaft portion 312 penetrates or loosely fits into the spacer 330. In addition, the spacer 300 may be fixed to the protrusion shaft portion 312.

Exhaust System

As shown in FIG. 1, the exhaust pipe 231 configured to exhaust an inner atmosphere of the process chamber 201 is provided at the reaction tube 203. A vacuum pump 246 serving as a vacuum exhauster is connected to the exhaust pipe 231 through a pressure sensor 245 and an APC (Automatic Pressure Controller) valve 244. The pressure sensor 245 serves as a pressure detector (pressure detection mechanism) to detect an inner pressure of the process chamber 201, and the APC valve 244 serves as an exhaust valve (pressure adjusting mechanism). With the vacuum pump 246 in operation, the APC valve 244 may be opened/closed to vacuum-exhaust the process chamber 201 or stop the vacuum exhaust. With the vacuum pump 246 in operation, an opening degree of the APC valve 244 may be adjusted based on the pressure detected by the pressure sensor 245, in order to control the inner pressure of the process chamber 201. An exhaust system is constituted mainly by the exhaust pipe 231, the APC valve 244 and the pressure sensor 245. The exhaust system may further include the vacuum pump 246. Similar to the components such as the nozzles 249a and 249b provided at the manifold 209, the exhaust pipe 231 may be provided at the manifold 209 instead of the reaction tube 203.

Peripheral Devices

A seal cap 219 serving as a furnace opening cover capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is disk-shaped. An O-ring 220b serving as a sealing part is provided on an upper surface of the seal cap 219 so as to be in contact with the lower end of the manifold 209.

A rotating mechanism 267 configured to rotate the boat 217 is provided under the seal cap 219 opposite to the process chamber 201. A rotating shaft 255 of the rotating mechanism 267 is connected to the boat 217 through the seal cap 219. As the rotating mechanism 267 rotates the boat 217, the wafers 200 supported by the boat 219 are rotated. A boat elevator 115 serving as an elevating mechanism is provided at the outside the reaction tube 203 vertically. The seal cap 219 may be moved upward/downward in the vertical direction by the boat elevator 115. When the seal cap 219 is moved upward/downward by the boat elevator 115, the boat 217 placed on the seal cap 219 may be loaded into the process chamber 201 or unloaded out of the process chamber 201.

The boat elevator 115 serves as a transfer device (transfer mechanism) that loads the boat 217, that is, the wafers 200 accommodated in the boat 217 into the process chamber 201 or unloads the boat 217, that is, the wafers 200 accommodated in the boat 217 out of the process chamber 201. A shutter 219s serving as a furnace opening cover capable of airtightly sealing the lower end opening of the manifold 209 is provided under the manifold 209. The shutter 219s is configured to close the lower end opening of the manifold 209 when the seal cap 219 is lowered to open the lower end opening of the manifold 209. The shutter 219s is made of a metal such as stainless steel, and is disk-shaped. An O-ring 220c serving as a sealing part is provided on an upper surface of the shutter 219s so as to be in contact with the lower end of the manifold 209. The opening/closing operation of the shutter 219s such as the elevation and the rotation is controlled by a shutter opening/closing mechanism 115s provided at the outside the reaction tube 203.

A temperature sensor 263 serving as a temperature detector is provided in the reaction tube 203. The state of electric conduction to the heater 207 is adjusted based on the temperature detected by the temperature sensor 263, such that the inner temperature of the process chamber 201 has a desired temperature distribution. Similar to the nozzles 249a and 249b, the temperature sensor 263 is provided along the inner wall of the reaction tube 203.

Controller

Figure 7:
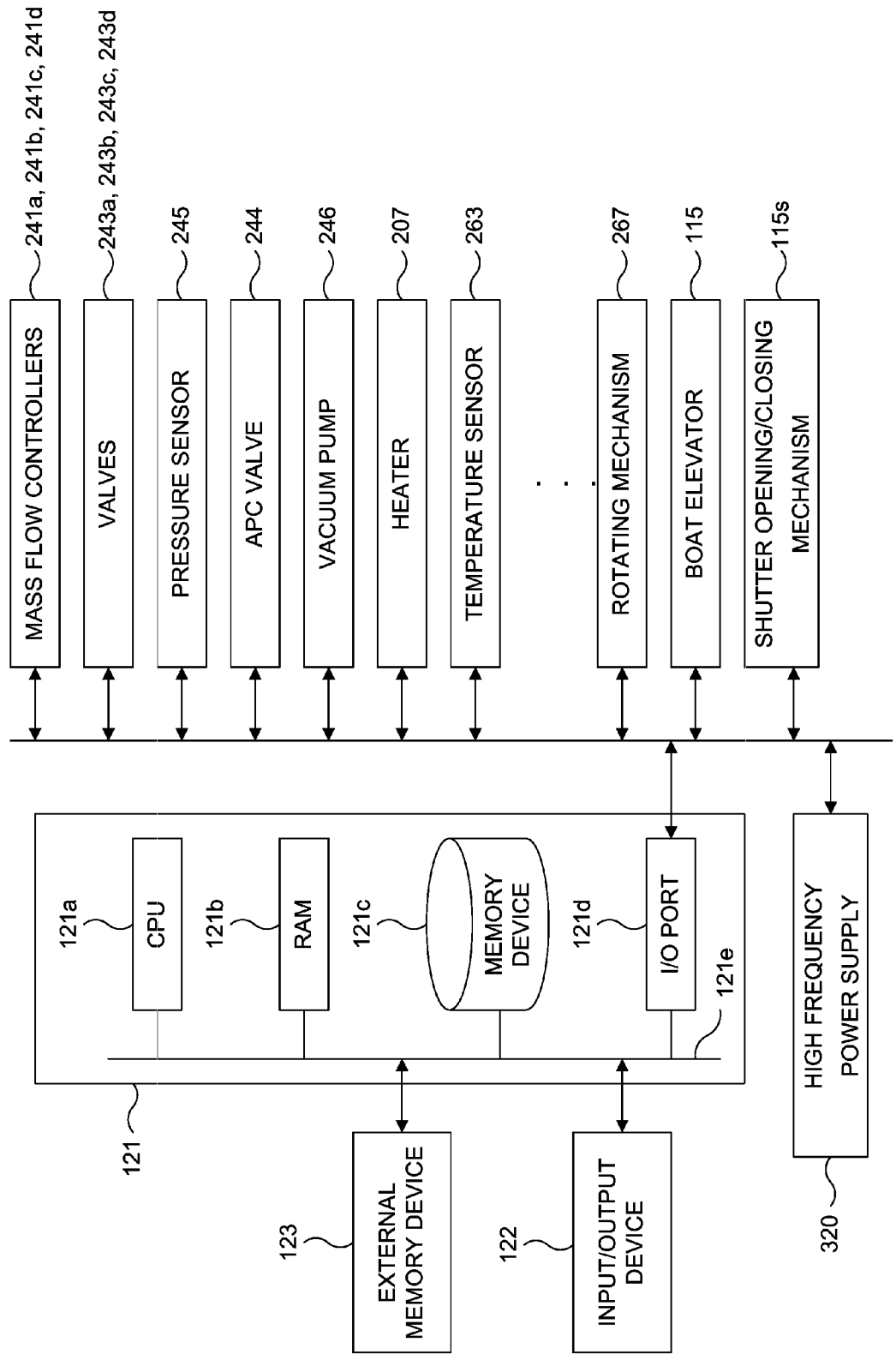
FIG. 7 is a block diagram schematically illustrating a configuration of a controller and components controlled by the controller of the substrate processing apparatus shown in FIG. 1.

Hereinafter, a controller will be described with reference to FIG. 7. As shown in FIG. 7, a controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 121.

The memory device 121c is configured by components such as a flash memory and HDD (Hard Disk Drive). For example, a control program for controlling the operation of the substrate processing apparatus, a process recipe containing information on the sequences and conditions of a substrate processing (film-forming process) described later are readably stored in the memory device 121c. The process recipe is obtained by combining steps of the substrate processing (film-forming process) described later such that the controller 121a can execute the steps to acquire a predetermine result, and functions as a program. Hereafter, the process recipe and the control program are collectively referred to as a "program". In the present specification, "program" may indicate only the process recipe, indicate only the control program, or indicate both of the process recipe and the control program. The RAM 121b is a memory area (work area) where a program or data read by the CPU 121a is temporarily stored.

The I/O port 121d is connected to the above-described components such as the mass flow controllers (MFCs) 241a, 241b, 241c and 241d, the valves 243a, 243b, 243c and 243d, the pressure sensor 245, the APC valve 244, the vacuum pump 246, the heater 207, the temperature sensor 263, the rotating mechanism 267, the boat elevator 115, the shutter opening/closing mechanism 115s and the high frequency power supply 320.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 202 may be configured to control various operations such as a control operation of the rotating mechanism 267, flow rate adjusting operations for various gases by the MFCs 241a, 241b, 241c and 241d, opening/closing operations of the valves 243a, 243b, 243c and 243d, an opening/closing operation of the APC valve 244, a pressure adjusting operation by the APC valve 244 based on the pressure sensor 245, a temperature adjusting operation of the heater 207 based on the temperature sensor 263, a start and stop of the vacuum pump 246, an operation of adjusting forward and reverse rotation of the boat 217 by the rotating mechanism 267, an elevating and lowering operation of the boat 217 by the boat elevator 1115, an opening/closing operation of the shutter 219s by the shutter opening/closing mechanism 115s and a power supply operation of the high frequency power supply 320.

The controller 121 may be embodied by installing the above-described program stored in an external memory device 123 into a computer. For example, the external memory device 123 may include a magnetic disk such as a hard disk, an optical disk such as a CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

(2) SUBSTRATE PROCESSING

Hereinafter, an exemplary substrate processing sequence of a substrate processing (film-forming process) of forming a film on the wafers 200, which is a part of manufacturing processes of a semiconductor device, will be described. The exemplary substrate processing sequence is performed by using the above-described substrate processing apparatus. Hereinafter, the components of the substrate processing apparatus are controlled by the controller 121.

In the present specification, the above-described exemplary substrate processing sequence shown in FIG. 8 according to the present embodiment may be represented as follows:

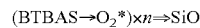

$$(\text{BTBAS} \rightarrow O_2^*) \times n \Rightarrow \text{SiO}$$

Substrate processing sequences of modified example and other embodiments, which will be described later, will be also represented in the same manner.

In the present specification, the term "wafer" may refer to "a wafer itself" or refer to "a wafer and a stacked structure (aggregated structure) of predetermined layers or films formed on the surface of the wafer". In addition, "surface of a wafer" refers to "a surface (exposed surface) of a wafer itself" or "the surface of a predetermined layer or film formed on the wafer, i.e. the top surface of the wafer as a stacked structure". Thus, in the present specification, "forming a predetermined layer (or film) on a wafer" may refer to "forming a predetermined layer (or film) on a surface of wafer itself" or refer to "forming a predetermined layer (or film) on a surface of a layer or a film formed on the wafer". In the present specification, "substrate" and "wafer" may be used as substantially the same meaning. That is, the term "substrate" may be substituted by "wafer" and vice versa.

Substrate Charging and Boat Loading Step: S1

The wafers 200 are charged into the boat 217 (substrate charging step). After the boat 217 is charged with the wafers 200, the shutter 219s is moved by the shutter opening/closing mechanism 115s to open the lower end opening of the manifold 209. Then, the boat 217 charged with the wafers 200 is elevated by the boat elevator 115 and loaded into the process chamber 201 (boat loading step). With the boat 217 loaded, the seal cap 209 seals the lower end opening of the manifold 209 via the O-ring 220b.

Pressure and Temperature Adjusting Step: S2

The vacuum pump 246 vacuum-exhausts the process chamber 201 until the inner pressure of the process chamber 201 reaches a desired pressure (vacuum degree). In the pressure and temperature adjusting step S2, the inner pressure of the process chamber 201 is measured by the pressure sensor 245, and the APC valve 244 is feedback-controlled based on the measured pressure (pressure adjusting step). The vacuum pump 246 continuously vacuum-exhausts the process chamber 201 until at least a film-forming process described later is completed.

The heater 207 heats the process chamber 201 until the temperature of the wafers 200 in the process chamber 201 reaches a desired temperature. The amount of the current flowing to the heater 207 is feedback-controlled based on the temperature detected by the temperature sensor 263 such that the inner temperature of the process chamber 201 has a desired temperature distribution (temperature adjusting step). The heater 207 continuously heats the process chamber 201 until at least the film-forming process described later is completed. However, when the film-forming process is performed at a temperature equal to or lower than the room temperature, it is not necessary to heat the process chamber 201 by the heater 207. When the substrate processing is performed only at the temperature equal to or lower than the room temperature, the heater 207 is unnecessary and the substrate processing apparatus may be implemented without the heater 207. In this case, it is possible to simplify the configuration of the substrate processing apparatus.

In the pressure and temperature adjusting step S2, the rotating mechanism 267 rotates the boat 217. As the rotating mechanism 267 rotates the boat 217, the wafers 200 supported by the boat 217 are rotated. The rotating mechanism 267 continuously rotates the boat 217 and the wafers 200 until at least the film-forming process described later is completed.

Film-Forming Process: S3, S4, S5 and S6

Figure 8:
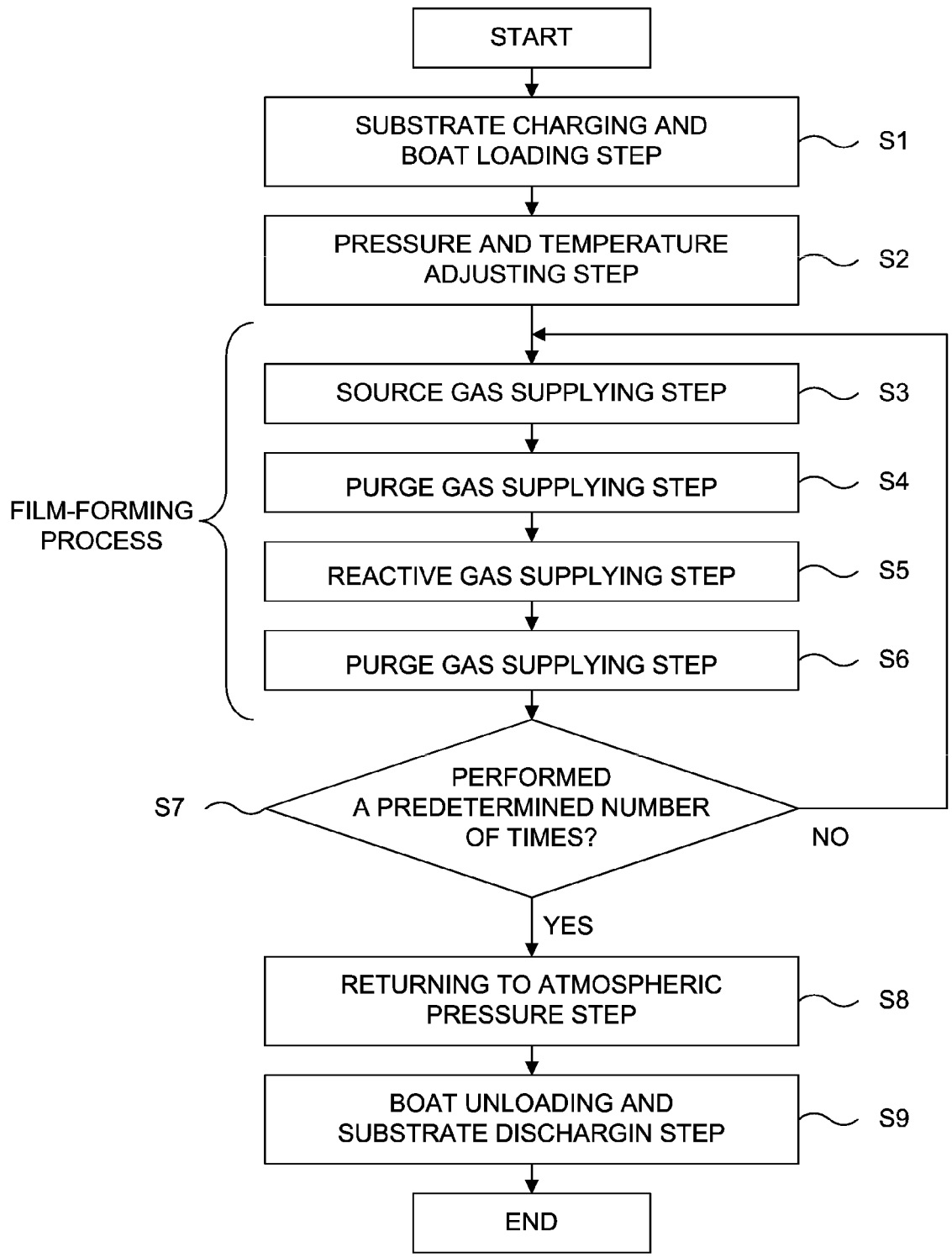
FIG. 8 is a flowchart schematically illustrating an exemplary substrate processing sequence using the substrate processing apparatus shown in FIG. 1.

Thereafter, the film-forming process is performed by performing a cycle including steps S3, S4, S5 and S6 described below a predetermined number of times as shown in FIG. 8.

Source Gas Supplying Step: S3 and S4

In the step S3, the BTBAS gas is supplied onto the wafers 200 in the process chamber 201.

In the step S3, the valve 243a is opened to supply the BTBAS gas into the gas supply pipe 232a. The flow rate of the BTBAS gas supplied into the gas supply pipe 232a is adjusted by the MFC 241a. The BTBAS gas having the flow rate thereof adjusted is then supplied onto the wafers 200 in the process chamber 201 through the plurality of gas supply holes 250a of the nozzle 249a, and is exhausted through the exhaust pipe 231. As described above, the BTBAS gas is supplied onto the wafers 200. In the step S3, simultaneously, the valve 243a is opened to supply the inert gas such as the $N_2$ gas through the gas supply pipe 232c. After the flow rate of the $N_2$ gas is adjusted by the MFC 241c, the $N_2$ gas having the flow rate thereof adjusted is supplied into the process chamber 201 with the BTBAS gas, and is exhausted through the exhaust pipe 231.

In order to prevent the BTBAS gas from entering the nozzle 249b, the valve 243d is opened to supply the $N_2$ gas into the gas supply pipe 232d. The $N_2$ gas supplied into the process chamber 201 through the gas supply pipe 232b and the nozzle 249b, and is exhausted through the exhaust pipe 231.

In the step S3, the flow rate of the BTBAS gas is adjusted to a predetermined flow rate by the MFC 241a. For example, the flow rate of the BTBAS gas may range from 1 sccm to 2,000 sccm, preferably from 10 sccm to 1,000 sccm. The flow rates of the $N_2$ gas supplied through the gas supply pipes 232c and 232d are adjusted to predetermined flow rates by the MFCs 241c and 241d, respectively. For example, the flow rates of the $N_2$ gas adjusted by the MFCs 241c and 241d may range from 100 sccm to 10,000 sccm, respectively. The inner pressure of the process chamber 201 is adjusted to a predetermined pressure. For example, the inner pressure of the process chamber 201 may range from 1 Pa to 2,666 Pa, preferably from 67 Pa to 1,333 Pa. The BTBAS gas is supplied onto the wafers 200 for a predetermined time. For example, the time duration of supplying the BTBAS gas onto the wafers 200 may range from 1 second to 50 seconds. In the present specification, for example, "1 sccm to 2,000 sccm" refers to "1 sccm or higher and 2,000 sccm or lower." That is, the range "1 sccm to 2,000 sccm" includes 1 sccm as a lower limit and 2,000 as an upper limit. The same also applies to other numerical ranges described herein such as the pressure, the time duration and the temperature.

In the step S3, the temperature of the heater 207 is set such that the temperature of the wafers 200 is at a predetermined temperature. For example, the temperature of the wafers 200 may range from 0° C. to 150° C., preferably from the room temperature (25° C.) to 100° C., more preferably from 10° C. to 90° C. The BTBAS gas has a high reactivity and is easily adsorbed on, e.g., the wafers 200. Therefore, even when the temperature of the process chamber 201 in the step S3 is low (for example, at room temperature), the BTBAS gas is chemically adsorbed on the wafers 200. Thereby, it is possible to obtain a practical film-forming rate. By setting the temperature of the heater 207 such that the temperature of the wafers 200 is equal to or lower than 150° C., or equal to or lower than 100° C. or equal to or lower than 90° C., respectively, it is possible to reduce the heat applied to the wafers 200 and to properly control the thermal history (thermal budget) of the wafers 200. In addition, when the temperature of the wafers 200 is equal to or higher than 0° C., the BTBAS gas is sufficiently adsorbed on the wafers 200. Thereby, it is possible to obtain a practical film-forming rate. Therefore, in the step S3, the temperature of the wafers 200 may range from 0° C. to 150° C., preferably from the room temperature to 100° C., more preferably from 40° C. to 90° C.

By supplying the BTBAS gas onto the wafers 200 under the above-described conditions, a silicon-containing layer having a thickness of, for example, less than one atomic layer (or one molecular layer) to several atomic layers (or several molecular layers) is formed on the wafers 200 (that is, on an underlying film or a base film of the surfaces of the wafers 200). The silicon-containing layer may include only a silicon layer, only an adsorption layer of the BTBAS, or both of them.

The silicon layer may include not only a continuous layer constituted by silicon, but also a discontinuous layer constituted by silicon and a silicon film constituted by overlapping the continuous layer and the discontinuous layer. Silicon constituting the silicon layer may include not only silicon completely separated from the other elements, but also silicon which is not completely separated from the amino group or silicon which is not completely separated from hydrogen (H).

The adsorption layer of the BTBAS may include not only a continuous adsorption layer constituted by the BTBAS molecules, but also a discontinuous adsorption layer constituted by the BTBAS molecules. The BTBAS molecules constituting the adsorption layer of the BTBAS may include not only BTBAS molecules completely separated from the other elements or molecules, but also BTBAS molecules in which bonds between silicon and the amino group are partially separated, BTBAS molecules in which bonds between silicon and hydrogen are partially separated, or BTBAS molecules in which bonds between nitrogen (N) and carbon (C) are partially separated. That is, the adsorption layer of the BTBAS may include only a physical adsorption layer of the BTBAS, only a chemical adsorption layer of the BTBAS or both of them.

In the present specification, "layer having thickness of less than one atomic layer (or one molecular layer)" indicates an atomic layer (or molecular layer) which is discontinuously formed, and "layer having thickness of one atomic layer (or molecular layer)" indicates an atomic layer (or molecular layer) which is continuously formed. The silicon-containing layer may indicate only the silicon layer, only the adsorption layer of the BTBAS, or both of them. For convenience of description, however, expressions such as "one atomic layer" and "several atomic layers" may be used for the silicon-containing layer and expressions such as "one molecular layer" and "several molecular layers" may be used for the adsorption layer of the BTBAS.

Under a condition where the BTBAS self-decomposes (thermally decomposes), that is, under a condition where the thermal decomposition reaction of the BTBAS occurs, the silicon layer is formed by deposition of silicon on the wafers 200. Under a condition where the BTBAS does not self-decompose (thermally decompose), that is, under a condition where the thermal decomposition reaction of the BTBAS does not occur, the adsorption layer of the BTBAS is formed by adsorption of the BTBAS on the wafers 200. However, in the present embodiment, since the temperature of the wafers 200 is adjusted to a low temperature, for example, equal to or lower than 150° C., the thermal decomposition of the BTBAS hardly occurs. As a result, the adsorption layer of the BTBAS rather than the silicon layer is more likely to be formed on the wafers 200.

When thickness of the silicon-containing layer exceeds several atomic layers, modification according to the step S5 described later is not spread to the entire part of the silicon-containing layer. The thickness of the silicon-containing layer has a minimum of less than one atomic layer. Therefore, the thickness of the silicon-containing layer may range from one atomic layer to several atomic layers. By adjusting the thickness of silicon-containing layer to one atomic layer or less, that is, a thickness equal to or less than one atomic layer, it is possible to improve the modification according to the step S5 described relatively, and to shorten the time required for the modification according to the step S5. In addition, it is possible to shorten the time required for forming the silicon-containing layer in the step 3. As a result, it is possible to shorten the processing time per cycle and the total processing time. That is, it is possible to improve the film-forming rate (deposition rate). By adjusting the thickness of the silicon-containing layer to a thickness equal to or less than one atomic layer, it is possible to control thickness uniformity of the film more easily.

After the silicon-containing layer is formed, the valve 243a is closed to stop the supply of the BTBAS gas into the process chamber 201. With the APC valve 244 open, the vacuum pump 246 vacuum-exhausts the inside of the process chamber 201 to remove a residual BTBAS gas in the process chamber 201 which did not react or which contributed to the formation of the silicon-containing layer or the by-products in the process chamber 201 from the process chamber 201 (step S4). By maintaining the valves 243c and 243d open, the $N_2$ gas is continuously supplied into the process chamber 201. The $N_2$ gas serves as a purge gas. However, the step S4 may be omitted. When the step S4 is omitted, the source gas supplying step includes only the step S3.

Instead of the BTBAS gas, for example, gases such as tetrakisdimethylaminosilane ($Si[N(CH_3)_2]_4$, abbreviated as 4DMAS) gas, trisdimethylaminosilane ($Si[N(CH_3)_2]_3H$, abbreviated as 3DMAS) gas, bisdimethylaminosilane ($Si[N(CH_3)_2]_2H_2$, abbreviated as BDMAS) gas and bisdiethylaminosilane ($Si[N(C_2H_5)_2]_2H_2$, abbreviated as BDEAS) gas may be uses as the source gas. Instead of the BTBAS gas, for example, various aminosilane source gases such as dimethylaminosilane (DMAS) gas, diethylaminosilane (DEAS) gas, dipropylaminosilane (DPAS) gas, diisopropylaminosilane (DIPAS) gas, butylaminosilane (BAS) gas and hexamethyldisilazane (HMDS) gas may be uses as the source gas. Instead of the BTBAS gas, for example, an inorganic halosilane source gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane gas, that is, silicon tetrachloride ($SiCl_4$, abbreviated as STC) gas, hexachlorodisilane ($Si_2Cl_6$, abbreviated as HCDS) gas and octachlorotrisilane ($Si_3Cl_8$, abbreviated as OCTS) gas may be used as the source gas. Instead of the BTBAS gas, for example, an inorganic silane source gas free of halogen such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

Instead of the $N_2$ gas, for example, rare gases such as argon (Ar) gas, helium (He) gas, neon (Ne) gas and xenon (Xe) gas may be used as the inert gas.

Reactive Gas Supplying Step: S5 and S6

After the source gas supplying step is completed, in the step S5, the plasma-excited $O_2$ gas serving as the reactive gas is supplied onto the wafers 200 accommodated in the process chamber 201.

In the step S5, the opening/closing operations of the valves 243b, 243c and 243d are controlled in the same manners as those of the valves 243a, 243c and 243d in the step S3. The flow rate of the $O_2$ gas is adjusted by the MFC 241b. The $O_2$ gas with the flow rate thereof adjusted is supplied into the process chamber 201 through the plurality of gas supply holes 250b of the nozzle 249b, and is then exhausted through the exhaust pipe 231. While the $O_2$ gas is supplied into the process chamber 201, the high frequency power (for example, electric power with frequency 13.56 MHz according to the present embodiment) is supplied from the high frequency power supply 320 to the electrode 300. The $O_2$ gas supplied into the process chamber 201 is excited to a plasma state in the process chamber 201 and supplied onto the wafers 200 as the active species ($O_2^*$) through the plurality of gas supply holes 250b, and is exhausted through the exhaust pipe 231. In the present embodiment, the $O_2$ gas excited to the plasma state is also referred to as "oxygen plasma".

In the step S5, the flow rate of the $O_2$ gas is adjusted to a predetermined flow rate by the MFC 241b. For example, the flow rate of the $O_2$ gas may range from 100 sccm to 10,000 sccm. The high frequency power supplied from the high frequency power supply 320 is adjusted to a predetermined power. For example, the high frequency power may range from 50 W to 1,000 W. The inner pressure of the process chamber 201 is adjusted to a predetermined pressure. For example, the inner pressure of the process chamber 201 may range from 10 Pa to 300 Pa. By using the plasma, it is possible to activate the $O_2$ gas even if the inner pressure of the process chamber 201 is such a relatively low pressure. The active species obtained by exciting the $O_2$ gas by the plasma is supplied onto the wafers 200 for a predetermined time. For example, the time duration of supplying the active species obtained by exciting the $O_2$ gas by the plasma onto the wafers 200 may range from 1 second to 50 seconds. The other processing conditions of the step S5 are the same as the processing conditions of the step S3, for example.

The silicon-containing layer formed on the surfaces of the wafers 200 are oxidized by the ions and the electrically neutral active species generated in the oxygen plasma as described later.

By supplying the $O_2$ gas onto the wafers 200 under the above-described conditions, the silicon-containing layer formed on the wafers 200 is plasma-oxidized. While the silicon-containing layer is plasma-oxidized, Si—N bonds and Si—H bonds included in the silicon-containing layer are broken by energy of plasma-excited $O_2$ gas. The nitrogen (N) and hydrogen (H) separated from the silicon (Si) and carbon (C) bonding to nitrogen are desorbed from the silicon-containing layer. The dangling bond of silicon in the silicon-containing layer produced due to the separation of nitrogen and hydrogen enables silicon in the silicon-containing layer to become bonded to the oxygen (O) in the $O_2$ gas to form a Si—O bond. As the reaction progresses, the silicon-containing layer is changed (modified) into a layer containing silicon and oxygen, that is, a silicon oxide layer (hereinafter, also referred to as a "SiO layer").

In order to modify the silicon-containing layer into the SiO layer, it is preferable that the $O_2$ gas is plasma-excited and supplied. When the $O_2$ gas is supplied under a non-plasma atmosphere, the energy required to oxidize the silicon-containing layer is insufficient in the above-described temperature range. Therefore, it is difficult to fully separate nitrogen or hydrogen from the silicon-containing layer or fully oxidize the silicon-containing layer to increase the number of the Si—O bond when the $O_2$ gas is supplied under a non-plasma atmosphere.

After the silicon-containing layer is modified into the SiO layer, the valve 243b is closed to stop the supply of the $O_2$ gas into the process chamber 201. In addition, the high frequency power supply 320 is controlled to stop the supply of the high frequency power to the electrode 300. With the APC valve 244 open, the vacuum pump 246 vacuum-exhausts the inside of the process chamber 201 to remove a residual $O_2$ gas in the process chamber 201 or the by-products in the process chamber 201 from the process chamber 201 (step S6). However, the step S6 may be omitted. When the step S6 is omitted, the reactive gas supplying step includes only the step S5.

Instead of the $O_2$ gas, gases such as nitrous oxide ($N_2O$) gas, nitric oxide (NO) gas, nitrogen dioxide ($NO_2$) gas, ozone ($O_3$) gas, hydrogen peroxide ($H_2O_2$) gas, water vapor ($H_2O$ gas), carbon monoxide (CO) gas and carbon dioxide ($CO_2$) gas may be used as the oxidizing agent (that is, the oxygen-containing gas to be excited by the plasma).

Instead of the $N_2$ gas, for example, rare gases described above in the step S4 may be used as the inert gas.

Performing a Predetermined Number of Times: S7

By performing the cycle wherein the steps S3, S4, S5 and S6 are performed non-simultaneously in this order a predetermined number of times (n times), a silicon oxide film (SiO film) having a predetermined composition and a predetermined thickness is formed on the wafers 200. It is preferable that the cycle is performed a plurality of times. That is, the cycle is performed (repeated) until the silicon oxide film (SiO film) having the predetermined thickness is obtained by controlling the silicon oxide layer (SiO layer) formed in each cycle to be thinner than the SiO film having the predetermined thickness and stacking the SiO layer by performing the cycle.

Returning to Atmospheric Pressure Step: S8

After the film-forming process described above is completed, the $N_2$ gas is supplied into the process chamber 201 through each of the gas supply pipes 232c and 232d, and then the $N_2$ gas supplied into the process chamber 201 is exhausted through the exhaust pipe 231. The inside of the process chamber 201 is purged with the $N_2$ gas, thus the residual gas such as the $O_2$ gas or the reaction by-products remaining in the process chamber 201 are removed from the process chamber 201 by supplying the $N_2$ gas (inert gas purging). Thereafter, the inner atmosphere of the process chamber 201 is replaced with the inert gas (substitution by inert gas), and the inner pressure of the process chamber 201 is returned to atmospheric pressure (returning to atmospheric pressure: S8).

Boat Unloading and Wafer Discharging Step

Thereafter, the seal cap 209 is lowered by the boat elevator 115 and the lower end of the manifold 209 is opened. The boat 217 with the processed wafers 200 charged therein is unloaded out of the reaction tube 203 through the lower end of the manifold 209 (boat unloading step). After the boat 217 is unloaded, the shutter 219s is moved by the shutter opening/closing mechanism 115s. The lower end of the manifold 209 is sealed by the shutter 219s through the O-ring 220c (shutter closing step). Then, the processed wafers 200 are then discharged from the boat 217 (wafer discharging step). After the processed wafers 200 are discharged from the boat 217, an empty boat 217 may be loaded into the process chamber 201.

As described above, the plasma in CCP mode is generated in the vertical type substrate processing apparatus by setting the temperature of the reaction tube 203 to 500° C., the pressure of the reaction tube 203 to 100 Pa and the frequency of the high frequency power supply 320 to 13.56 MHz. The electrode 300 having a length of 1 m, a width of 15 mm and a thickness of 1 mm is used to generate the plasma in CCP mode. The plurality of electrodes 300 having alternating polarities with an electrode pitch (distance between centers of the electrodes) of 25 mm are arranged alternately on the outer wall of the reaction tube 203. The plasma in CCP mode is generated in the vertical type substrate processing apparatus using the above-described configurations.

As described above, it is preferable that the pressure in the processing furnace 202 during the substrate processing is controlled to a predetermined pressure. For example, the pressure in the processing furnace 202 may range from 10 Pa to 300 Pa. When the pressure in the processing furnace 202 is lower than 10 Pa, the mean free path of gas molecules may be longer than the Debye length of plasma, and the direct collision between the plasma and the wall of the processing furnace 202 wall may become conspicuous. Therefore, it is difficult to suppress the generation of the particles. In addition, when the pressure in the processing furnace 202 is higher than 300 Pa, the generation efficiency of the plasma may be saturated. Therefore, even if the reactive gas is supplied, the amount of the generated plasma may not be changed, so that the reactive gas may be wasted. In addition, the mean free path of the gas molecules may be shortened, so that the transport efficiency of the plasma active species to the wafers 200 may deteriorate.

(3) EFFECTS ACCORDING TO THE PRESENT EMBODIMENT

According to the present embodiment, one or more advantageous effects described below can be achieved.

(a) By fixing the electrode to the electrode fixing part (fixing jig), it is possible to suppress the deformation of the electrode (plasma electrode).

(b) Since the deformation of the electrode can be suppressed, it is possible to supply the active species into the process chamber more stably and to perform the wafers by the substrate processing more uniformly.

(c) By configuring the electrode fixing part to be an arc shape having a central angle within a range from 30° to 240° and by fixing the electrode to the electrode fixing part, it is possible to minimize the blocking of the thermal energy transferred from the heater on the outer circumferential surface of the electrode fixing part so as not to affect the substrate processing.

(4) MODIFIED EXAMPLES

While the present embodiment is described in detail, the present embodiment is not limited thereto. For example, the present embodiment may be modified in various ways as in the following modified example.

First Modified Example

According to the present embodiment, the electrode 300 is fixed to the protrusion 310 of the quartz cover 301. However, according to the first modified example, the quartz cover 301 may include an outer quartz cover 301-1 facing the heater 207 and an inner quartz cover 301-2 facing the reaction tube 203, and the electrode 300 may be interposed between the outer quartz cover 301-1 and the inner quartz cover 301-2. According to the first modified example, in order to prevent the positional misalignment of the electrode 300, a holding groove of the same shape as the electrode 300 may be further provided between the outer quartz cover 301-1 and the inner quartz cover 301-2. The holding groove may be formed on a surface of only one of the outer quartz cover 301-1 and the inner quartz cover 301-2, or on surfaces of both of the outer quartz cover 301-1 and the inner quartz cover 301-2.

Other Embodiments

While the technique is described by way of the above-described embodiment and the modified example, the above-described technique is not limited thereto. The above-described technique may be modified in various ways without departing from the gist thereof.

For example, the above-described embodiment is described by way of an example in which the reactant (reactive gas) is supplied after the source gas is supplied. However, the above-described technique is not limited thereto. The above-described technique may be applied when the order of supplying the source gas and the reactive gas is reversed. That is, the above-described technique may be applied when the source gas is supplied after the reactive gas is supplied. By changing the order of supplying the gases, it is possible to change (adjust) the quality or the composition of the film formed on the wafers.

For example, the above-described embodiment is described by way of an example in which the SiO film is formed on the wafers. However, the above-described technique is not limited thereto. The above-described technique may also be applied to form the other films on the wafers 200. For example, the above-described technique may be preferably applied to form a silicon-based oxide films such as a silicon oxycarbide film (SiOC film), a silicon oxycarbonitride film (SiOCN film) and a silicon oxynitride film (SiON film).

For example, the above-described embodiment is described by way of an example in which the SiO film is formed by using the BTBAS gas as the source gas and the O$_2$ gas the reactive gas. However, the above-described technique is not limited thereto. For example, the above-described techniques may be applied to form the other films such as a silicon nitride film (SiN film), a silicon oxynitride film (SiON film), a silicon oxycarbonitride film (SiOCN film), a silicon oxycarbide film (SiOC film), a silicon carbonitride film (SiCN film), a silicon boronitride film (SiBN film), a silicon boron carbonitride film (SiBCN film) and a boron carbonitride film (BCN film) according to the film-forming process described above by using a nitrogen (N)-containing gas such as NH$_3$ gas, a carbon (C)-containing gas such as propylene (C$_3$H$_6$) gas and a boron (B)-containing gas such as boron trichloride (BCl$_3$) instead of or in addition to the gases described above. In addition, the order of supplying the gases may be changed appropriately. When the above-described technique is applied to the film-forming process of the above-described films, the processing conditions of the film-forming process for the above-described films may be substantially the same as those of the film-forming process according to the above-described embodiment and the same advantageous effects as the above-described embodiment may be obtained. When the above-described technique is applied to the film-forming process of the above-described films, the above-described reactive gas such as the O$_2$ gas may be used as the oxidizing agent (reactive gas).

For example, the above-described embodiment is described by way of an example in which the SiO film is formed on the wafers 200. However, the above-described technique is not limited thereto. For example, the above-described technique may be preferably applied to form a metal-based oxide film or a metal-based nitride film containing metal element such as titanium (Ti), zirconium (Zr), hafnium (Hf), tantalum (Ta), niobium (Nb), aluminum (Al), molybdenum (Mo) and tungsten (W) on the wafers 200. That is, the above-described techniques may be preferably applied to form the other films such as a TiO film, a TiOC film, a TiOCN film, a TiON film, a TiN film, a TiBN film, a TiBCN film, a ZrO film, a ZrOC film, a ZrOCN film, a ZrON film, a ZrN film, a ZrBN film, a ZrBCN film, a HfO film, a HfOC film, a HfOCN film, a HfON film, a HfN film, a HfBN film, a HfBCN film, a TaO film, a TaOC film, a TaOCN film, a TaON film, a TaN film, a TaBN film, a TaBCN film, a NbO film, a NbOC film, a NbOCN film, a NbON film, a NbN film, a NbBN film, a NbBCN film, a AlO film, a AlOC film, a AlOCN film, a AlON film, a AlN film, a AlbN film, a AlbCN film, a MoO film, a MoOC film, a MoOCN film, a MoON film, a MoN film, a MoBN film, a MoBCN film, a WO film, a WOC film, a WOCN film, a WON film, a WN film, a WBN film and a WBCN film.

For example, various gases such as tetrakis (dimethylamino) titanium (Ti[N(CH$_3$)$_2$]$_4$, abbreviated as TDMAT) gas, tetrakis (ethylmethylamino) hafnium (Hf[N(C$_2$H$_5$)(CH$_3$)]$_4$, abbreviated as TEMAH) gas, tetrakis (ethylmethylamino) zirconium (Zr[N(C$_2$H$_5$)(CH$_3$)]$_4$, abbreviated as TEMAZ) gas, trimethylaluminum (Al(CH$_3$)$_3$, abbreviated as TMA) gas, titanium tetrachloride (TiCl$_4$) gas and hafnium tetrachloride (HfCl$_4$) gas may be used as the source gas to form the above-described films.

The above-described technique may also be applied to form a metalloid film containing a metalloid element or the metal-based film containing metal element. The processing sequences and the processing conditions of the film-forming process of the metalloid film or the metal-based film may be substantially the same as those of the film-forming process according to the above-describe embodiment or the modified example. Even when the above-described technique is applied to form the metalloid film or the metal-based film, the same advantageous effects as the above-described embodiment or the modified example may be obtained.

The recipe used for the substrate processing (film-forming process) may be separately prepared depending on the contents of the substrate processing, and stored in the memory device 121c through an electrical telecommunication line or the external memory device 123. When the substrate processing is started, the CPU 121a may select a proper recipe among a plurality of recipes stored in the memory device 121c, depending on the contents of the substrate processing. Thus, it is possible to form plural kinds of films having various composition ratios, qualities and thicknesses by only a single substrate processing apparatus in a universal and highly reproducible manner. Furthermore, it is possible to reduce the burden of an operator, and to start the substrate processing promptly without an operation mistake.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium having the recipe written therein. The input/output device 122 installed in the existing substrate processing apparatus may be operated to directly change the existing recipe which is already installed in the substrate processing apparatus to the new recipe.

According to the technique described herein, it is possible to perform a substrate processing uniformly.

What is claimed is:

1. A substrate processing apparatus comprising:
a reaction tube defining a processing chamber wherein a substrate is processed;
an electrode provided at an outer circumferential surface of the reaction tube and configured to generate plasma in the process chamber;
an electrode fixing part configured to fix the electrode thereto;
a heater provided at an outer circumferential surface of the electrode fixing part and configured to heat an inside of the reaction tube; and
a spacer configured to provide a predetermined gap between the electrode and a surface of the electrode fixing part,
wherein the electrode fixing part comprises a fixing portion comprising a protrusion shaft portion engaged with the electrode and a protrusion head portion configured to suppress the electrode from being released from the fixing portion, and
wherein the spacer comprises an elastic body to generate a pressing force applied on the electrode toward the protrusion head portion.

2. The substrate processing apparatus of claim 1, wherein the electrode comprises:
a slit portion along which the protrusion shaft portion is slidable; and
a cutout portion through which the protrusion head portion passes.

3. The substrate processing apparatus of claim 1, wherein the electrode comprises:
at least one first electrode connected to a high frequency power supply; and
at least one second electrode connected to a reference potential and grounded,
wherein the at least one first electrode and the at least one second electrode are alternately arranged.

4. The substrate processing apparatus of claim 1, wherein the electrode is made of an oxidation resistant material.

5. The substrate processing apparatus of claim 1, wherein the electrode comprises a deformation suppressing structure.

6. The substrate processing apparatus of claim 1, wherein the electrode fixing part has an arc shape such that a central angle between both ends of the electrode with reference to a center of the reaction tube is within a range from 30° to 240°.

7. The substrate processing apparatus of claim 1, wherein the electrode fixing part comprises a quartz cover made of quartz.

8. The substrate processing apparatus of claim 1, wherein the electrode fixing part is installed at the outer circumferential surface of the reaction tube except where a gas supply system and a gas exhaust mechanism are located in the reaction tube.

9. The substrate processing apparatus of claim 1, wherein the electrode is fixed between the reaction tube and the heater by the electrode fixing part interposed therebetween.

10. The substrate processing apparatus of claim 1, wherein the spacer is fixed to one of the electrode and the electrode fixing part.

11. A method of manufacturing a semiconductor device, comprising:
(a) loading a substrate into a processing chamber of a substrate processing apparatus comprising a reaction tube defining the processing chamber wherein the substrate is processed; an electrode provided at an outer circumferential surface of the reaction tube and configured to generate plasma in the processing chamber; an electrode fixing part configured to fix the electrode thereto; a heater provided at an outer circumferential surface of the electrode fixing part and configured to heat an inside of the reaction tube; and a spacer configured to provide a predetermined gap between the electrode and a surface of the electrode fixing part, wherein the electrode fixing part comprises a fixing portion comprising a protrusion shaft portion engaged with the electrode and a protrusion head portion configured to suppress the electrode from being released from the fixing portion, and wherein the spacer comprises an elastic body to generate a pressing force applied on the electrode toward the protrusion head portion;
(b) processing the substrate by generating plasma in the processing chamber; and
(c) unloading the substrate out of the processing chamber.

12. An electrode fixing part comprising:
an electrode configured to generate plasma in a reaction tube;
a fixing portion configured to fix the electrode thereto; and
a spacer configured to provide a predetermined gap between the electrode and the fixing portion,
wherein the fixing portion comprises a protrusion shaft portion engaged with the electrode and a protrusion head portion configured to suppress the electrode from being released from the fixing portion, and
wherein the spacer comprises an elastic body to generate a pressing force applied on the electrode toward the protrusion head portion.

13. The electrode fixing part of claim 12, wherein the electrode comprises a cutout portion through which the protrusion shaft portion is engaged with the electrode.

14. The electrode fixing part of claim 12, wherein the electrode fixing part has an arc shape such that a central angle between both ends of the electrode with reference to a center of the reaction tube is within a range from 30° to 240°.

15. The electrode fixing part of claim 12, wherein the electrode fixing part is adapted to being installed at an outer circumferential surface of the reaction tube except where a gas supply system and a gas exhaust mechanism are located in the reaction tube.

16. The electrode fixing part of claim 12, wherein the electrode comprises:
- at least one first electrode connected to a high frequency power supply; and
- at least one second electrode connected to a reference potential and grounded,
- wherein the at least one first electrode and the at least one second electrode are alternately arranged.

* * * * *